United States Patent [19]

Schneider et al.

[11] 4,375,429
[45] Mar. 1, 1983

[54] PHOTODICHROIC CRYSTALS

[75] Inventors: Irwin Schneider; William C. Collins, both of Alexandria, Va.; Oscar Imber, Wheaton; Philipp H. Klein, Silver Spring, both of Md.

[73] Assignee: The United States of America as represented by the Secretary of the Navy, Washington, D.C.

[21] Appl. No.: 850,508

[22] Filed: Nov. 10, 1977

Related U.S. Application Data

[62] Division of Ser. No. 573,277, Apr. 30, 1975, Pat. No. 4,087,374.

[51] Int. Cl.$^3$ .............................................. F21V 9/00
[52] U.S. Cl. ..................................... 252/584; 423/490
[58] Field of Search .................. 156/DIG. 71, 624; 252/300 R, 584; 423/490

[56] References Cited

U.S. PATENT DOCUMENTS

| | | | |
|---|---|---|---|
| 2,422,907 | 6/1947 | Johnson | 423/490 |
| 2,550,173 | 4/1951 | Swinehart et al. | 423/490 |
| 3,238,017 | 3/1966 | Yamaguchi et al. | 423/484 |
| 3,282,641 | 11/1966 | Sfiligoj et al. | 423/490 |
| 3,476,690 | 11/1969 | Carnall, Jr. | 252/300 R |
| 3,565,700 | 2/1971 | Root | 423/490 |
| 3,935,302 | 1/1976 | Pastor et al. | 423/490 |

OTHER PUBLICATIONS

Collins et al., "Additive and Electrolytic Coloration of NaF", Applied Physics Letters, vol. 24, No. 9, pp. 403-404.
Voszka et al., Kristall und Technik, 8(12), 1973, pp. 1347 to 1356.
Stacey et al., Advances in Fluorine Chemistry, vol. 4, Butterworth, Inc., Washington, D.C. 1965, pp. 142 to 149.

Primary Examiner—Leland A. Sebastian
Attorney, Agent, or Firm—Robert F. Beers; William T. Ellis; Thomas E. McDonnell

[57] ABSTRACT

The improvement of the electrolytic and additive methods of coloring alkali fluoride crystals comprising the step of selecting an alkali fluoride crystal having the impurities of between 0 and 5 ppmA of OH; between 0 and 50 ppmA of one or more alkaline earth cations, of which between 0 and 10 ppmA $Mg^{++}$ and between 0 and 10 ppmA $Ca^{++}$; between 0 and 50 ppmA of non-fluorine halide anions; between 0 and 10 ppmA of $SiF_6^=$; between 0 and 30 ppmA of other ions; and the method of preparing these crystals which comprises converting the alkali fluoride to alkali hydrofluoride, crystallizing and vacuum drying the alkali hydrofluoride crystals, regenerating the alkali fluoride by expelling hydrogen fluoride, and crystallizing the alkali fluoride.

8 Claims, 5 Drawing Figures

PHOTODICHROIC CRYSTALS

This is a division of application Ser. No. 573,277, filed Apr. 30, 1975, now U.S. Pat. No. 4,087,374.

BACKGROUND OF THE INVENTION

The invention relates generally to a method for preparing photodichroic alkali fluoride crystals and more particularly to additive and electrolytic coloration of alkali fluoride crystals.

Photodichroism is the property of absorbing wavelengths of light differently along each axis of the crystal. To impart this property in a crystal, the crystal is colored, i.e., has color centers introduced into its crystalline structure. The most common of these centers are the F, $F_A$, M, and $M_A$ centers with the M-center being the most important.

Alkali halide crystals containing color centers such as the aforementioned ones have shown considerable promise at optical elements capable of reversible, online write-erase-read operations where the reading would be nondestructive. Information would be related to the presence or absence of dichroic absorption (i.e.—differences in absorption of polarized light) and would be introduced into the crystal by causing M-center reorientations with polarized light.

The most promising alkali halide for possible use near room temperature is NaF. Unfortunately, this fluoride, like the other alkali fluorides, has been colored only through the use of ionizing radiation such as X-rays or high-energy electrons. But such a technique introduces interstitials which eventually recombine with the color centers and mutually annihilate. The crystals accordingly are less stable than crystals colored by other techniques.

Two methods of coloring alkali crystals which do not produce interstitials are the additive and electrolytic methods. However, attempts to produce well-characterized color centers in alkali fluoride crystals by these techniques have not been successful. The crystals are either not colored or contain metallic-colored particles with diameters as large as 30 nm. Such particles give rise to Tyndall scattering with an apparent absorption in the wavelength range from 505 to 570 nm.

It has been known that alkali earth metals cations cause metallic particles to form during coloration. Previous methods were highly successful in removing these cations along with other foreign cations except for $Mg^{++}$ and $Ca^{++}$. Also these methods of purifying alkali fluorides were not able to eliminate the fluorosilicate ion ($SiF_6^=$) below 10 ppmA and were extremely slow and inconsistent in removing the hydroxyl ion.

Throughout this disclosure concentrations are expressed in units of ppmA. Such units are synonymous with the units of moles of additive per 1,000,000 moles of crystal.

SUMMARY OF THE INVENTION

It is therefore an object of this invention to produce alkali fluoride crystals with well characterized color centers by an additive or by an electrolytic method.

Another object of this invention is to provide a method of consistently preparing alkali fluoride crystals with a maximum hydroxyl ion concentration of 0.5 ppmA.

Another object of this invention is to provide a method of preparing alkali fluoride crystals with a maximum hydroxyl ion concentration of 0.5 ppmA in less than 3 days.

And another object of this invention is to provide alkali fluoride crystals with a maximum hydroxyl ion concentration of 5 ppmA.

And still another object of this invention is to provide alkali fluoride crystals with a maximum hydroxyl concentration of 0.5 ppmA.

And yet another object of this invention is to provide an alkali fluoride crystal with color centers having greater stability.

A further object of this invention is to provide alkali fluoride crystals with color centers having less fatigue in switching polarization directions.

A still further object of this invention is to provide colored alkali fluoride crystals with greater purity in their absorption spectra.

These and other objects are achieved with an alkali fluoride crystal having impurities of between 0 and 5 ppmA of $OH^-$; between 0 and 50 ppmA of one or more alkaline earth cations, of which between 0 and 10 ppmA $Mg^{++}$ and between 0 and 10 ppmA $Ca^{++}$; between 0 and 50 ppmA of non-fluorine halide anions; between 0 and 10 ppmA of $SiF_6^=$; between 0 and 30 ppmA of other ions; and the method of preparation which comprises converting the alkali fluoride to alkali hydrofluoride, crystallizing the alkali hydrofluoride, vacuum drying these crystals, regenerating alkali fluoride from the alkali hydrofluoride by expelling gaseous HF in a heated stream of an inert gas, melting the NaF in an inert atmosphere, withdrawing up to 90% of the melt into a single-crystal boule by the Czochralski technique, and repeating the above melting and withdrawing steps.

DETAILED DESCRIPTION OF THE INVENTION

Figure 1:
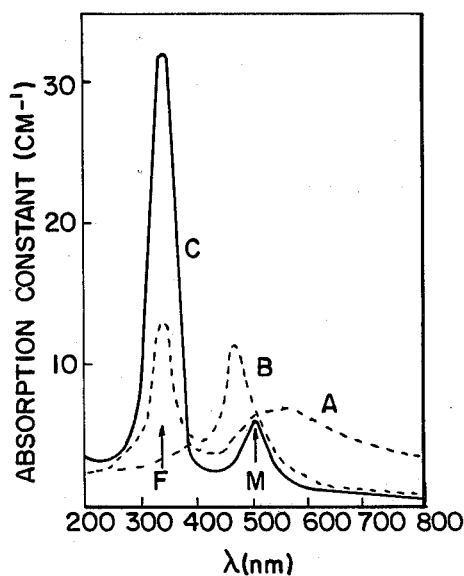
FIG. 1 compares the absorption spectra of additively colored research grade commercially obtained NaF and of additively colored NaF of this invention.

It is not fully understood why the trace presence of $OH^-$ with alkaline earth cations is detrimental to the coloration of alkali fluoride crystals by the additive and electrolytic methods. However, since the ions complex easily and the complexes are considerably larger than the fluoride ion, the mobilities of these complexes are considerably less than that of the fluoride. Thus it is believed that the complexes impede the movement of fluoride ions through the crystal lattice which is basic to the mechanism of both the additive and electrolytic methods of coloration. This is only a possible explanation and is not meant to bind the present invention to any explanation. Although the exact mechanism is not fully understood, it is now evident that the hydroxyl ion has an enormous influence on the coloration of alkali fluoride crystals and that exceptionally colored alkali fluoride crystals are now possible.

In the practice of the instant invention, alkali fluoride is reacted with an aqueous hydrogen fluoride solution at a temperature from about 25° C. to about 90° C. with 80° C. to 90° C. preferred to form an alkali hydrofluoride. The purity of the alkali fluoride is not critical. Due to considerations of processing time and cost, the CP grade is preferred. Likewise, great latitude is possible with the concentration of the aqueous HF solution, but for processing considerations the concentration should preferably be above 20 percent by weight. The effect of using excessively strong acid, e.g. 40% by weight, is the production of polyhydrofluorides. Such alkali polyhydrofluorides do not present any problems except to add additional heating steps to the alkali fluoride regeneration procedure. This aspect is discussed in detail later.

If the hydrofluoride reaction was carried out at the preferred temperature range, the alkali hydrofluoride is crystallized by reducing the temperature of the solution to room temperature. A slow reduction of temperature (on the order of 10 to 12 hours) is preferred because of the larger resulting crystals. If the hydrofluoridation reaction was carried out at a lower temperature than 80° C., the temperature of the solution is increased to 80° C. to 90° C. and additional precipitated hydrofluoride is dissolved in the hot solution. Upon equilibration, the solution is decanted and slowly cooled as before.

The crystals are separated from the liquid. One possible procedure comprises draining the excess liquid off and vacuum drying the crystals at a vacuum of 10 torr or less for about 12 to about 24 hours. Since it is critical that the crystals contain no water, as much water should be removed at this stage as possible.

The regeneration of alkali fluoride from the hydrofluoride crystals is an extremely important technique of the method of this invention. It has been determined that bubbling of the hydrofluoride, caused by heating the crystals too rapidly, adversely affects the yield of alkali fluoride. Further the alkali fluoride being generated must remain molten and be allowed to consolidate and free itself of bubbles for at least 1½ hours in order to minimize water recontamination.

The regeneration of the alkali fluoride has to occur in an inert and noncontaminating atmosphere. Examples of gases which may be used are argon and helium. Exemplary of possible getters for the gases are titanium, barium, and calcium. The atmosphere most often used is Ti-gettered argon. Similarly the equipment in contact with the crystals must be inert and noncontaminating. Accordingly, such equipment must be constructed from or coated with platinum, fluorinated polymers, glassy or other forms of pure carbon, and the like. The hydrogen fluoride is carried away by a suitably heated stream of an inert gas.

Alkali polyhydrofluorides lose hydrogen fluoride at a lower temperature than alkali monohydrofluorides. If such polyhydrofluorides are present, the crystals are initially heated to a temperature from about 80° C. to about 90° C., taking at least 2 hours to reach this temperature. The temperature is then maintained for at least one hour thereby eliminating water. In order to eliminate any unreacted hydrogen fluoride, the temperature is raised in a time not less than 3 hours to a temperature from about 100° C. to about ¾ of the Centigrade temperature at which HF gas starts to evolve from the crystals as determined from the phase diagram. This temperature is held for at least one hour.

The temperature is again raised over a period of time not less than 5 hours and preferably of about 6 hours to the temperature at which the polyhydrofluoride again begins to evolve HF and is held at that temperature for about 2 hours. This progression is continued up to the temperature at which the alkali monohydrofluoride evolves a pressure of 760 torr of hydrogen fluoride. That temperature is held for at least 4 hours and preferably for 6 hours in order to ensure the complete conversion to alkali fluoride.

If the initial crystals are mostly, i.e., 95%, the monohydrofluoride, the temperature is raised over a period of time not less than 5 hours and preferably to 6 hours above 100° C. but not higher than three fourths of the Centigrade temperature at which the monohydrofluoride begins to evolve HF. This heating serves to expel unreacted HF and water. The temperature is raised over a period of time of at least 5 hours and preferably of 6 hours to the temperature at which a pressure of 760 torr of HF is evolved from the crystals as determined by the phase diagram. Heating is continued at this temperature for at least 4 hours and preferably for 6 hours.

At this point the regeneration procedure is the same regardless of whether the crystals were initially a mixture of mono and polyhydrofluorides or predominantly the mono form. The temperature is again increased over a period of time of at least 6 hours and preferably of 12 hours to a temperature of about one half of the melting point of the particular alkali fluoride in degrees Centigrade. The temperature is held for about one hour before the temperature is increased to the melting point of the alkali fluoride. This latest temperature increase takes at least 2 hours and preferably takes 4 hours and the temperature is held for at least 2 hours. This last heating is to ensure that no HF is present in the molten alkali fluoride.

The melt, having been freed of water and HF, is crystallized into a bar in the following manner. The temperature is reduced by 100° C. to 200° C. over a period of time of at least 4 hours and preferably of 6 hours. With this temperature reduction a polycrystalline bar begins to form. The bar is completed as the temperature is further reduced to room temperature over a period of time of at least 4 hours.

The crystallization procedure further comprises withdrawing up to 75-90% of the melt into a single-crystal boule preferably by the Czochralski technique. The Czochralski technique was first published by Czochralski J., in Z. Physik Chem. 93, 219-221 (1918) and is herein incorporated by reference. Other crystallization techniques may be used in the practice of this invention.

To illustrate the purification method of this invention the following example is presented. It is understood that the example and all the examples of the disclosure are given by way of illustration and not meant to limit in any manner the specification or the claims to follow.

EXAMPLE I

Reagent-grade (Baker and Adamson) NaF was reacted with a 40% aqueous solution of hydrofluoric acid (HF) at a temperature of 90° C. in a platinum beaker. This reaction gave almost a 100% yield of the monohydrofluoride. The $NaHF_2$ was crystallized by reducing the temperature to room temperature (20° C.) in 12 hours in a platinum beaker. The liquid was drained from the platinum beaker and the crystals were vacuum dried at a vacuum of 10 torr for 18 hours in a teflon evaporation disk. Regenerating NaF comprised heating in a glassy carbon boot in a horizontal tube furnace the crystals to 150° C. in 6 hours, maintaining 150° C. for 2 hours, heating to 225° C. in 6 hours, holding 225° C. for 6 hours, heating to 500° C. in 12 hours, holding 500° C. for 1 hour, heating to 1000° C. in 4 hours, holding for 2 hours, and furnace-cooling to room temperature. The NaF was remelted in a platinum crucible and was crystallized by withdrawing 80% of the melt into a single-crystal boule by the Czochralski technique, then reducing the temperature to room temperature in 2 hours. The middle 90% of the crystal was remelted and regrown by a repetition of the Czochralski method, into a second-generation single-crystal boule.

The second-generation NaF crystals were found by spark-source mass spectrography to contain 10–30 ppmA of chlorine, 1–10 ppmA of calcium, and about 2 ppmA of potassium. Absorption measurements at 0.151 and 2.68 $\mu$m revealed the presence of 0.05–0.5 ppmA of $OH^-$ in undoped specimens and about 1 ppmA of $OH^-$ in Li-doped crystals.

The alkali fluoride crystals of this invention can be colored by any additive or electrolytic technique. As was expected, the heavier alkali fluorides such as potassium fluoride and rubidium fluoride were the easiest and quickest to color. The two heaviest alkali fluorides, i.e., cesium and francium do not have a crystalline structure suitable for any practical use of their colored centers.

The following two examples illustrate an additive coloration and an electrolytic coloration of NaF crystal prepared by the method of Example I.

EXAMPLE II

For additive coloration, the crystals and about one-tenth their weight of Na metal were sealed at room temperature under 0.5 atm. of argon in a vacuum-annealed stainless-steel tube. The temperature is raised to 900° C. and is maintained at 900° C. for 16 hours. Then the crystals are cooled in 4 hours to room temperature.

EXAMPLE III

For electrolytic coloration, crystals were held in slowly flowing helium between a pointed tungsten electrode and a flat graphite anode, with an electric field strength of 100 V/cm applied.

The next examples illustrate the additive coloration of this invention. The crystals had a hydroxyl ion concentration of 2 ppmA.

EXAMPLE IV

KF crystals and about one-tenth of their weight of K metal were sealed at room temperature under 0.5 atm. of argon in a vacuum-annealed stainless-steel tube. The temperature was raised to 700° C. and held for 16 hours. Then the temperature was reduced to room temperature in 4 hours.

The absorption spectra of the crystals colored in Example II were determined. The results are shown and compared with commercially available NaF crystals in FIG. 1. Curve A represents the absorption data of a research grade commercially available crystal which was prepared by the "Cornell" method and additively colored by a method similar to the method of Example II. The color centers in a slice were dispersed by reheating to 900° C. for one minute and by cooling to room temperature in 5 minutes. Curve B represents the absorption data of a slice of the same commercial crystal. It was reheated in argon to 960° C. for one minute and then quenched (5 sec.) to room temperature (20° C.). Curve C represents one of the crystals of Example II which also had a post coloring anneal of 880° C. followed by a quench of 10 sec. to room temperature.

As can be seen in FIG. 1, NaF crystals of this invention give a true M-center as the crystals of Curves A and B do not. Further the quantity of F-centers is three times greater than the best of the commercial NaF crystals.

Figure 2:
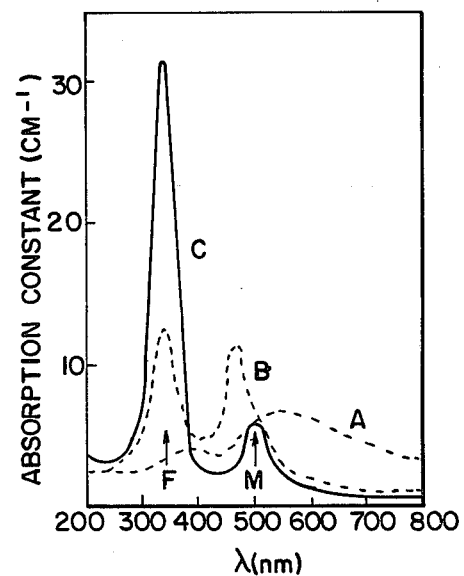
FIG. 2 compares the absorption spectra of the commercially obtained crystals of FIG. 1 and of electrolytically colored NaF crystals of this invention.

The same determinations were made for crystals of Example III and a comparison similar to FIG. 1 was made in FIG. 2. Curves A and B represent the additively colored commercial crystals and Curve C is the data from a crystal of Example III with a post coloring anneal. Again the same exceptional results were obtained.

Figure 3:
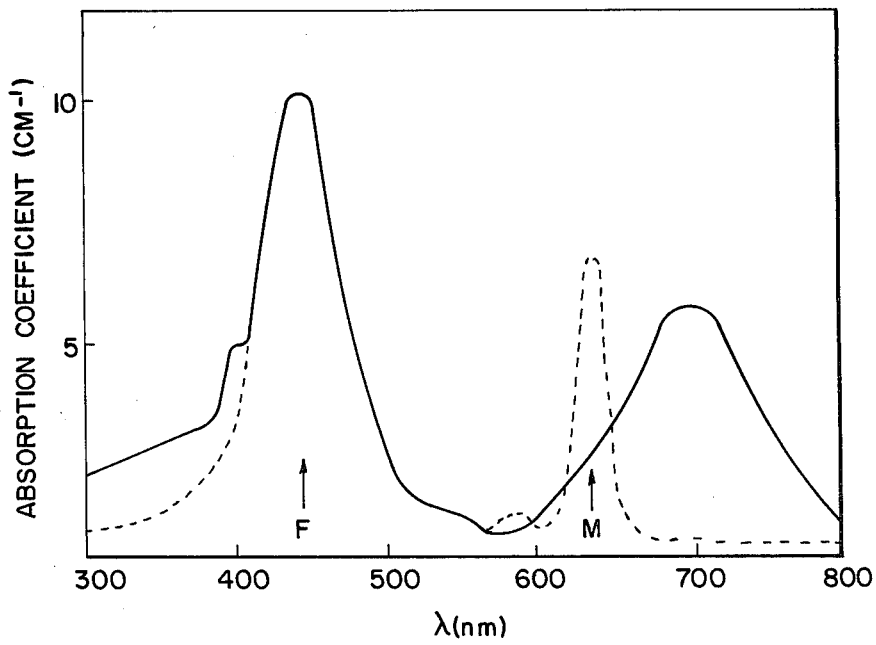
FIG. 3 compares the absorption date of high purity commercially obtained KF and of KF of this invention, both have been additively colored with K.

FIG. 3 graphically compares the absorption spectra of research grade commercially obtained KF prepared by the "Cornell" method and of KF of this invention. Curve A represents the commercial KF and Curve B represents the KF of this invention.

Figure 4:
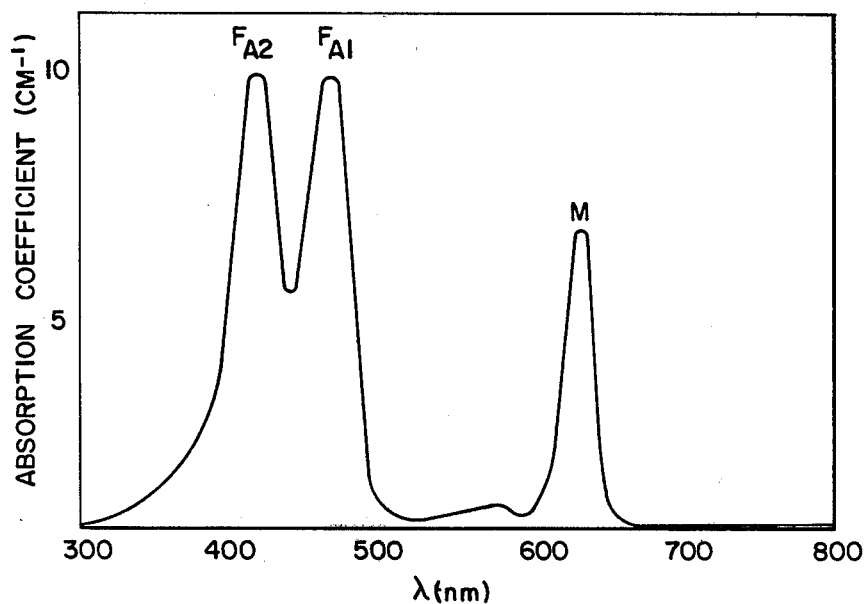
FIG. 4 graphically shows the absorption spectra of KF of this invention, doped with NaF additively colored with K and aggregated.
Figure 5:
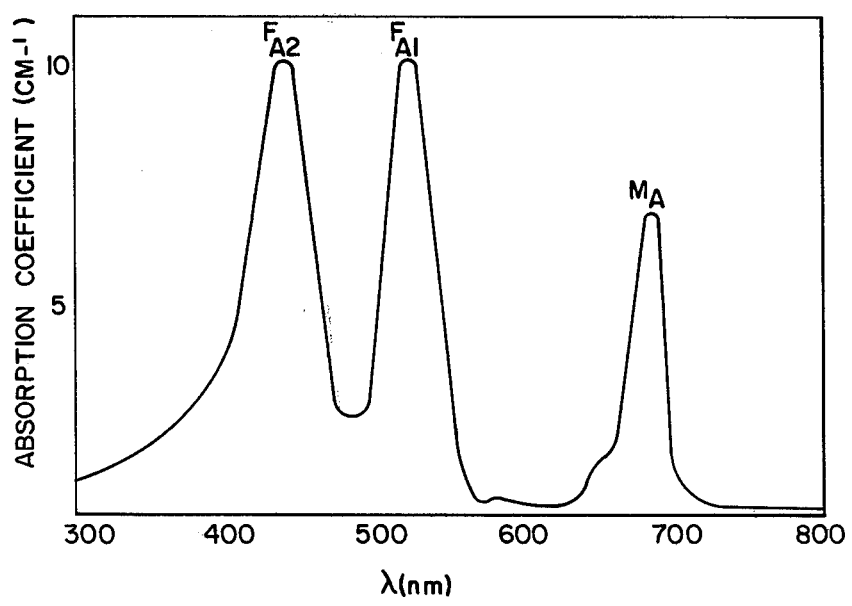
FIG. 5 graphically shows the absorption spectra of KF of this invention, doped with LiF, additively colored with K and aggregated.

The alkali fluoride crystals of this invention may be doped in addition to being colored in order to form the $F_A$ and $M_A$ centers in the crystals upon aggregation. FIGS. 4 and 5 graphically show the absorption spectra of KF crystals doped with NaF and LiF.

As can be clearly seen from the figures exceptionally colored KF crystals are possible if the crystals selected do have a hydroxyl ion concentration between 0 and 5 ppmA, a $SiF_6^=$ between 0 and 10 ppmA, $Mg^{++}$ concentration between 0 and 10 ppmA, and $Ca^{++}$ concentration between 0 and 10 ppmA. Such crystals have only been obtained consistently and conveniently with the method of the present invention. This method has without failure produced the important NaF and KF crystals with the aforedescribed purity in less than three days. All temperatures in the specification and in the claims to follow are in degrees Centigrade.

Obviously many modifications and variations of the present invention are possible in light of the above teachings. It is therefore to be understood that, within the scope of the appended claims, the invention may be practiced otherwise than as specifically described.

What is claimed and desired to be secured by Letters Patent of the United States is:

1. An alkali fluoride crystal consisting essentially of $OH^-$ in an amount from greater than 0 to about 0.5 ppmA, one or more alkaline earth cations in an amount between 0 and 50 ppmA, non-fluoride halide anions in an amount between 0 and 50 ppmA, $SiF_6^=$ in an amount between 0 and 10 ppmA, other ions in an amount between 0 and 30 ppmA, and said alkali fluoride.

2. The alkali fluoride crystal of claim 1 wherein said alkali fluoride is selected from the class consisting of lithium fluoride, sodium fluoride, and potassium fluoride.

3. The alkali fluoride crystal of claim 1 wherein said alkali fluoride is selected from the class consisting of sodium fluoride and potassium fluoride.

4. The alkali fluoride crystal of claim 1 wherein said alkali fluoride is sodium fluoride.

5. The alkali metal fluoride crystal of claim 2 wherein said $OH^-$ is between 0 and 0.5 ppmA and said alkaline earth cations comprise from 1 to 10 ppmA of calcium and from 1 to 2 pmmA of potassium.

6. The alkali metal fluoride crystal of claim 3 wherein said OH$^-$ is between 0 and 0.5 ppmA and said alkaline earth cations comprise from 1 to 10 ppmA of calcium and from 1 to 2 ppmA of potassium.

7. The alkali metal fluoride crystal of claim 4 wherein said OH$^-$ is between 0 and 0.5 ppmA and said alkaline earth cations comprise from 1 to 10 ppmA of calcium and from 1 to 2 ppmA of potassium.

8. An alkali metal fluoride crystal selected from the class consisting of lithium fluoride, sodium fluoride, potassium fluoride, and rubidium fluoride prepared by a method which comprises:

a. the step of converting said alkali metal fluoride crystal to alkali metal hydrofluoride which comprises reacting said alkali metal fluoride crystal with an aqueous solution of hydrogen fluoride at a temperature from about 25° C. to about 90° C., whereby a mixture of alkali metal monohydrofluoride and alkali metal polyhydrofluorides is formed;

b. the step of crystallizing, in a period of time from 10 to 12 hours, said mixture of alkali metal monohydrofluoride and of alkali metal polyhydrofluorides, whereby numerous crystals are produced;

c. the step of regenerating in an inert and non-contaminating atmosphere alkali metal fluoride from crystals of said mixture of alkali metal monohydrofluoride and alkali metal polyhydrofluorides which comprises:

1. removing water and unreacted hydrogen fluoride from said crystals;
2. expelling, if necessary, reacted hydrogen fluoride from said alkali metal polyhydrofluorides of said mixture sufficient to obtain a mixture having at least 95% of alkali metal monohydrofluoride;
3. heating said crystals to the temperature at which a pressure of 760 torr of hydrogen fluoride is evolved from said crystals;
4. maintaining said temperature for at least four (4) hours;
5. heating, in not less than 6 hours, said crystals to a temperature of about one half of the melting point in degrees Celsius of said crystals;
6. maintaining said temperature for about 1 hour;
7. heating, in not less than 2 hours, said crystals to the melting point of said crystals; and
8. maintaining said temperature for at least 2 hours, thereby completely forming molten alkali metal fluoride and eliminating all hydrogen fluoride;

d. the step of crystallizing said molten alkali metal fluoride in not less than 8 hours into a single crystal.

* * * * *